United States Patent [19]

Tatematsu

[11] Patent Number: 4,464,750
[45] Date of Patent: Aug. 7, 1984

[54] SEMICONDUCTOR MEMORY DEVICE

[75] Inventor: Takeo Tatematsu, Yokohama, Japan

[73] Assignee: Fujitsu Limited, Kawasaki, Japan

[21] Appl. No.: 329,942

[22] Filed: Dec. 11, 1981

[30] Foreign Application Priority Data

Dec. 23, 1980 [JP] Japan .............................. 55-182292

[51] Int. Cl.$^3$ .......................................... G06F 11/00
[52] U.S. Cl. ...................................... 371/21; 371/71; 365/201
[58] Field of Search .................. 365/200, 201; 371/21, 371/71

[56] References Cited

U.S. PATENT DOCUMENTS

| 3,940,601 | 2/1976 | Henry et al. | 371/21 |
| 4,055,754 | 10/1977 | Chesley | 371/21 |
| 4,334,307 | 6/1982 | Bourgeois et al. | 371/21 |
| 4,342,103 | 7/1982 | Higuchi et al. | 365/201 |

Primary Examiner—Jerry Smith
Assistant Examiner—Michael R. Fleming
Attorney, Agent, or Firm—Staas & Halsey

[57] ABSTRACT

A semiconductor memory device including a plurality of memory blocks (1-1, 1-2, 1-3, 1-4) each including a plurality of memory cells ($C_{00}$, $C_{01}$, ..., $C_{31,127}$). When test data is transmitted from one selected memory cell within each of the memory blocks to one of data bus pairs connected to the memory blocks ($DB_1$, $\overline{DB}_1$, ..., $DB_4$, $\overline{DB}_4$), all of the test data on the data bus pairs is checked simultaneously by a read test circuit (10). The semiconductor memory device includes first and second power supply terminals and each of the memory blocks having the memory cells arranged in rows and columns. Also included are pairs of data buses, each pair being connected to one of the memory blocks, a cell selection device for selecting one memory cell within each of said memory blocks and connecting the selected memory cells to the corresponding data buses, and a block selection circuit for selecting one pair of the pairs of data buses during a write mode and writing input data into all of the selected memory cells. Further included is a read test circuit connected to the first and second power supply terminals and to the data buses, for detecting the potential of each of the data buses and for checking simultaneously whether the data on the data buses transmitted from the selected memory cells is correct.

8 Claims, 9 Drawing Figures

SEMICONDUCTOR MEMORY DEVICE

BACKGROUND OF THE INVENTION

The present invention relates to a semiconductor memory device in which a large number of memory cells are divided into blocks.

In recent years, it has been shown that a semiconductor memory device can have its capacity increased from 16 kbits, 64 kbits and 256 kbits to 1 Mbits. However, as the capacity of a semiconductor memory device increases, the time required for testing it also increases. For example, if the time for testing a 16 kRAM is 1, the time for testing a 64 kRAM is 4 and the time for testing a 256 kRAM is 8. In addition, the manufacturing yield of such memory devices is low and, accordingly, the number of defective devices is much larger than the number of good devices. Therefore, the time required for testing all the devices, including defective devices, is very large, which makes the manufacturing cost high.

On the other hand, in a large capacity semiconductor memory device, such as a 64 kRAM, a plurality of memory cells are divided into blocks, which allows decoders to be simple and small in electrical structure. In this case, addresses are allocated commonly to each of the blocks. Therefore, the operation of selecting one memory cell within all of the memory cells is performed by selecting one memory cell within each of the blocks and by selecting one block within the blocks.

When testing a semiconductor memory device in which a plurality of memory cells are divided into blocks, which testing is the same as that in a semiconductor memory device without having such blocks, definite test data, such as "1", is written into each of the memory cells. In this state, the test data stored in each of the memory cells is read out and checked as to whether the read-out data is "1". However, in this case, the read operation must be repeated by the total number of memory cells and, in addition, the write operation must also be repeated for the number of memory cells. As a result, it takes a long time to test a semiconductor memory device in which memory cells are divided into blocks.

SUMMARY OF THE INVENTION

It is an object of the present invention to provide a semiconductor memory device in which the time required for testing is small.

According to the present invention, there is provided a semiconductor memory device including: first and second power supply terminals and a plurality of memory blocks, each comprising memory cells arranged in rows and columns. Also included are plurality of pairs of data buses each pair being connected to one of the memory blocks and cell selection means for selecting one memory cell within each of the memory blocks so as to connect the selected memory cells to the corresponding data buses. Additionally included are a block selection circuit for selecting one pair of the pairs of data buses during the write mode so as to write input data into one of the selected memory cells and a read test circuit, connected to the first and second power supply terminals and to the data buses, for detecting the potential of each of the data buses, so as to check simultaneously whether the data at the data buses transmitted from the selected memory cells is correct.

The present invention will be more clearly understood from the description as set forth below with reference to the accompanying drawings.

DESCRIPTION OF THE PREFERRED EMBODIMENTS

Figure 1:
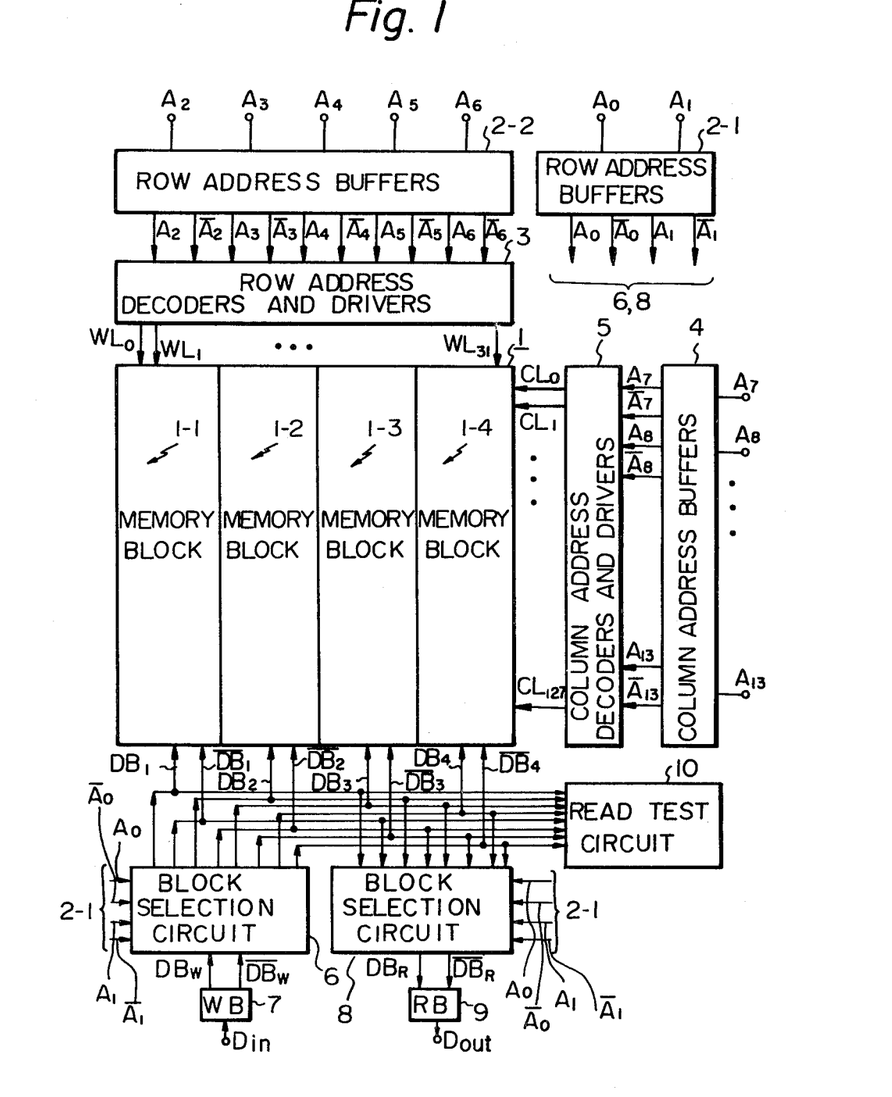
FIG. 1 is a block diagram illustrating an embodiment of the semiconductor memory device according to the present invention.

In FIG. 1, which illustrates an embodiment of the semiconductor memory device according to the present invention, 1 is a main memory cell matrix which is divided into four memory blocks 1-1, 1-2, 1-3 and 1-4 each comprising $4096(=2^{12})$ one bit memory cells; $A_0$ through $A_6$ are row address signals; and $A_7$ through $A_{13}$ are column address signals. In this case, one memory cell in each of the memory blocks 1-1, 1-2, 1-3 and 1-4 is selected by using the row address signals $A_2$ through $A_6$ and the column address signals $A_7$ through $A_{13}$ and, in addition, one memory block is selected by using the row address signals $A_0$ and $A_1$. In addition, 2-1 and 2-2 comprise row address buffers for converting a TTL level of the address signals $A_0$ through $A_6$ into a MOS level of address signals $A_0$ through $A_6$ and their inverted signals $\overline{A}_0$ through $\overline{A}_6$, and 3 comprises row address decoders and drivers for selecting one row memory cell array within each of the memory blocks 1-1, 1-2, 1-3 and 1-4. 4 comprises column address buffers for converting a TTL level of column address signals $A_7$ through $A_{13}$ into a MOS level of address signals $A_7$ through $A_{13}$ and their inverted signals $\overline{A}_7$ through $\overline{A}_{13}$ which are supplied to column address decoders and drivers 5 for selecting one column memory cell array within the main memory cell matrix 1.

$DB_1, \overline{DB}_1; \ldots;$ and $DB_4, \overline{DB}_4$ are data buses for each of the memory blocks 1-1, 1-2, 1-3 and 1-4. Normally, during the write mode, one pair of the data buses $DB_1, \overline{DB}_1; \ldots;$ and $DB_4, \overline{DB}_4$ is selected by a block selection circuit 6, so that the selected pair of the data buses are connected to write data buses $DB_w$ and $\overline{DB}_w$, respectively, and, thus, to a write buffer 7 for receiving input data $D_{in}$. Similarly, during the read mode, one pair of the data buses $DB_1, \overline{DB}_1; \ldots; DB_4, \overline{DB}_4$ is selected by a block selection circuit 8, so that the selected pair of the data buses are connected to the read data buses $DB_R$ and $\overline{DB}_R$, respectively, and, thus, a read buffer 9 for generating output data $D_{out}$.

According to the present invention, all of the data buses $DB_1, \overline{DB}_1, \ldots, DB_4$ and $\overline{DB}_4$ are connected to a read test circuit 10 which enters into operation only during the read test mode.

Figure 2:
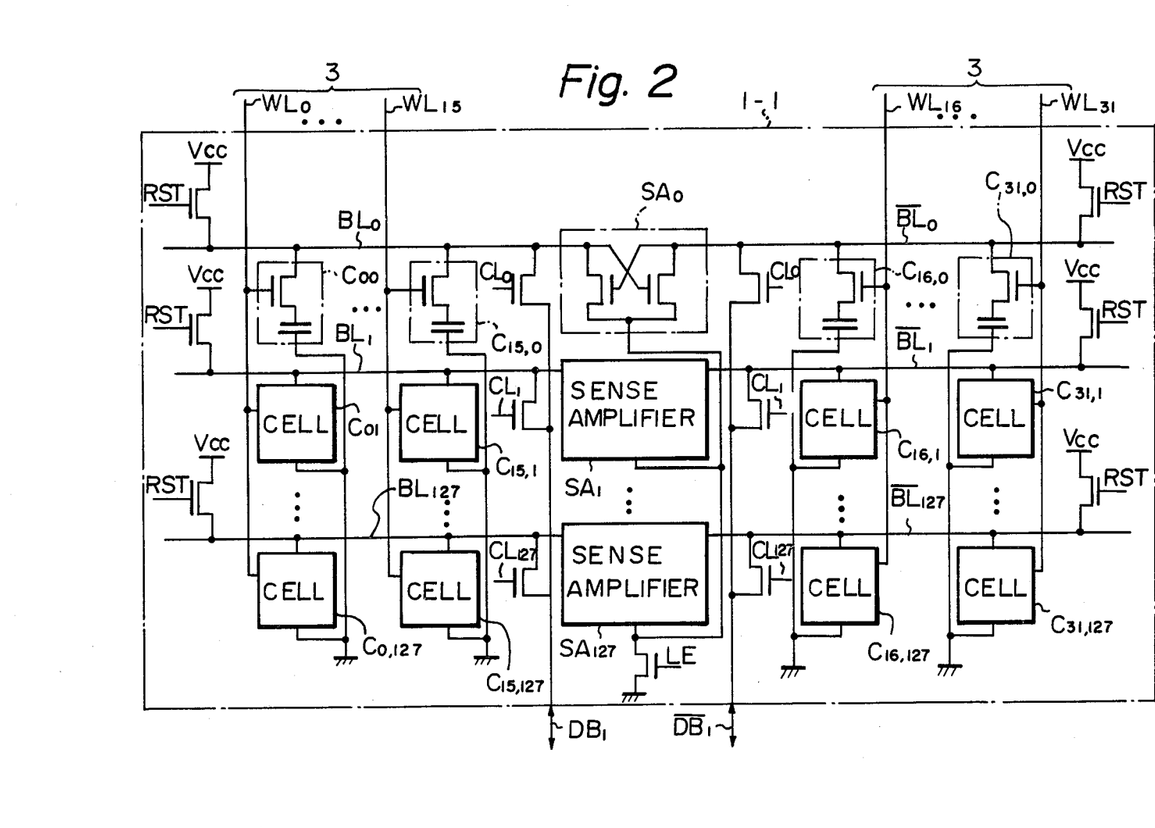
FIG. 2 is a detailed block diagram of the memory block 1-1 of FIG. 1.

FIG. 2 is a detailed block diagram of the memory block 1-1 of FIG. 1. Note that the circuits of the other memory blocks 1-2, 1-3 and 1-4 are the same as the circuit of the memory block 1-1. In FIG. 2, $SA_0, SA_1, \ldots, SA_{127}$ are sense amplifiers each connected to pairs of bit lines $BL_0$, $\overline{BL}_0$; $BL_1$, $\overline{BL}_1$; ...; $BL_{127}$, $\overline{BL}_{127}$. The sense amplifiers $SA_0$, $SA_1$, ..., $SA_{127}$ are activated commonly by a latch enable signal LE. RST is a reset signal for precharging the bit lines $BL_0$, $\overline{BL}_0$, $BL_1$, $\overline{BL}_1$, ..., $BL_{127}$, $\overline{BL}_{127}$ during the stand-by mode. At intersections occurring between the word lines $WL_0$, ..., $WL_{15}$, $WL_{16}$, ..., $WL_{31}$ and the bit lines $BL_0$, $\overline{BL}_0$, $BL_1$, $\overline{BL}_1$, ..., $BL_{127}$, $\overline{BL}_{127}$, memory cells $C_{00}$, ..., $C_{15,0}$, $C_{16,0}$, ..., $C_{31,0}$, ..., $C_{31,127}$ which are, for example, of a one-transistor and one-capacitor type, are provided. In addition, $CL_0$, $CL_1$, ..., $CL_{127}$ are column selection signals for selecting a bit line pair and connecting the selected bit line pair to the pair of data buses $DB_1$ and $\overline{DB}_1$.

The operation of the circuit of FIG. 2 will be briefly explained. First, during the stand-by mode (or precharge mode), the potential of the signal RST is caused to be high so as to precharge all of the bit lines $BL_0$, $\overline{BL}_0$, $BL_1$, $\overline{BL}_1$, ..., $BL_{127}$, $\overline{BL}_{127}$. Next, after the potential of the signal RST falls, during the row selection mode, the potential of only one of the word lines $WL_0$, ..., $WL_{15}$, $WL_{16}$, ..., $WL_{31}$ is caused to be high, so as to select one memory cell within each pair of the bit line pairs. Next, during the sensing mode, the potential of the signal LE is caused to be high so as to activate all of the sense amplifiers $SA_0$, $SA_1$, ..., $SA_{127}$. Next, during the column selection mode, the potential of only one of the column selection signals $CL_0$, $CL_1$, ..., $CL_{127}$ is caused to be high, so that the potential of each of the selected bit line pairs is transmitted to the data buses $DB_1$ and $\overline{DB}_1$, respectively. Therefore, the data stored in the selected memory cell is determined by the difference in potential between the data buses $DB_1$ and $\overline{DB}_1$.

Figure 3:
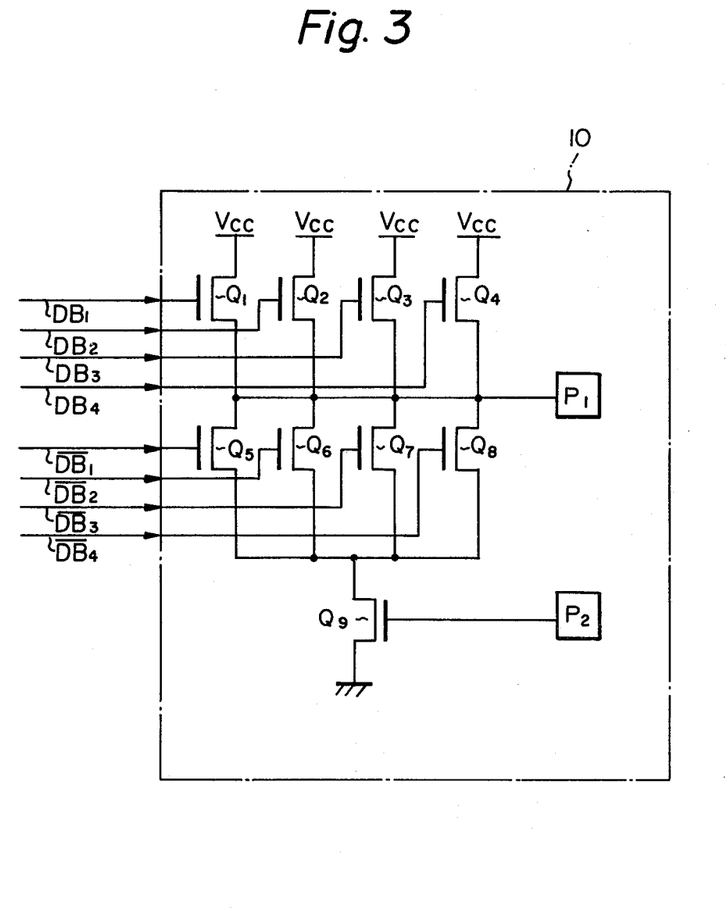
FIG. 3 is a circuit diagram of the read test circuit 10 of FIG. 1.

FIG. 3 is a circuit diagram of the read test circuit 10 of FIG. 1. In FIG. 3, $Q_1$ through $Q_4$ are MOS transistors each having a gate connected to one of the positive data buses $DB_1$ through $DB_4$, while $Q_5$ through $Q_8$ are MOS transistors each having a gate connected to one of the negative data buses $\overline{DB}_1$ through $\overline{DB}_4$. The transistors $Q_1$ through $Q_4$ are connected in series to the transistors $Q_5$ through $Q_8$, respectively, and in addition, the connection point of such transistors is connected to a common pad $P_1$ which serves as an output terminal.

$Q_9$ is a MOS transistor for activating the read test circuit 10 when the potential at a pad $P_2$ is high. In addition, note that the read test circuit 10 is provided between two power supply terminals whose potentials are $V_{cc}$ and ground, respectively.

As illustrated in FIG. 3, each circuit formed by the transistors $Q_1$ and $Q_5$, the transistors $Q_2$ and $Q_6$, the transistors $Q_3$ and $Q_7$, and the transistors $Q_4$ and $Q_8$ is a kind of push-pull circuit.

The read test operation of the memory device of FIGS. 1 and 2 by the read test circuit 10 of FIG. 3 will now be explained. Usually, during the test mode, the same data is written into a memory cell of each of the memory blocks 1-1, 1-2, 1-3 and 1-4 to which the same address is allocated. Now assume that the data "1" is written into memory cell $C_{00}$ of each of the memroy blocks 1-1, 1-2, 1-3 and 1-4. When this data stored in the memory cell $C_{00}$ is read out, the potential of each of the data buses $DB_1$ through $DB_4$ is, for example, high, and the potential of each of the data buses are $\overline{DB}_1$ through $\overline{DB}_4$ is low. As a result, the transistors $Q_1$ through $Q_4$ are turned on, while the transistors $Q_5$ through $Q_8$ are turned off. Note that, in this case, all the transistors are of an n-channel type. Therefore, the potential at the pad $P_1$ becomes high and equals $V_{cc}$. Similarly, now assume that the data "0" is written into memory cell $C_{01}$ of each of the memory blocks 1-1, 1-2, 1-3 and 1-4. When this data stored in the memory cell $C_{01}$ is read out, the potential of each of the data buses $DB_1$ through $DB_4$ is low, while the potential of each of the data buses $\overline{DB}_1$ through $\overline{DB}_4$ is high. As a result, the transistors $Q_1$ through $Q_4$ are turned off, while the transistors $Q_5$ through $Q_8$ are turned on. Therefore, the potential at the pad $P_1$ becomes low and equals the ground level.

Contrary to the above, when the date "0" is written into the cell $C_{00}$ of the memory block 1-1, in spite of the attempt to write the data "1" thereinto, the transistor $Q_1$ is turned off and the transistors $Q_2$, $Q_3$ and $Q_4$ are turned on. In addition, the transistor $Q_5$ is turned on and the transistors $Q_6$, $Q_7$ and $Q_8$ are turned off. As a result, the potential at the pad $P_1$ becomes $$V_{cc} \times \frac{R_{on2}}{R_{on1} + R_{on2}}$$

where $R_{on1}$ is an equivalent resistance of the on-state transistors $Q_2$, $Q_3$ and $Q_4$ and $R_{on2}$ is an equivalent resistance of the on-state transistor $Q_5$. Similarly, when the data "1" is written into the cell $C_{01}$ of the memory block 1-1, in spite of the attempt to write the data "0" thereinto, the transistor $Q_1$ is turned on and the transistors $Q_2$, $Q_3$ and $Q_4$ are turned off. In addition, the transistor $Q_5$ is turned off and the transistor $Q_6$, $Q_7$ and $Q_8$ are turned on. As a result, the potential at the pad $P_1$ becomes $$V_{cc} \times \frac{R_{on2}'}{R_{on1}' + R_{on2}'}$$

where $R_{on1}'$ is an equivalent resistance of the on-state transistor $Q_1$ and $R_{on2}'$ is an equivalent resistance of the on-state transistors $Q_6$, $Q_7$ and $Q_8$.

In summary, if the same or correct data "1" or "0" is normally written into memory cells to which the same address is allocated, the potential at the pad $P_1$ equals $V_{cc}$ or the ground level. However, if undesired or wrong data is written into at least one memory cell, the potential at the pad $P_1$ equals an intermediate value between the ground level and $V_{cc}$ determined by the equivalent resistances of the on-state transistors. Therefore, by checking the potential at the pad $P_1$ of FIG. 3, determining whether the device of FIG. 1 is normal or abnormal can easily be accomplished four times faster, as compared with the case where the potential at the outputs of the block selection circuit 8 are checked.

Figure 4:
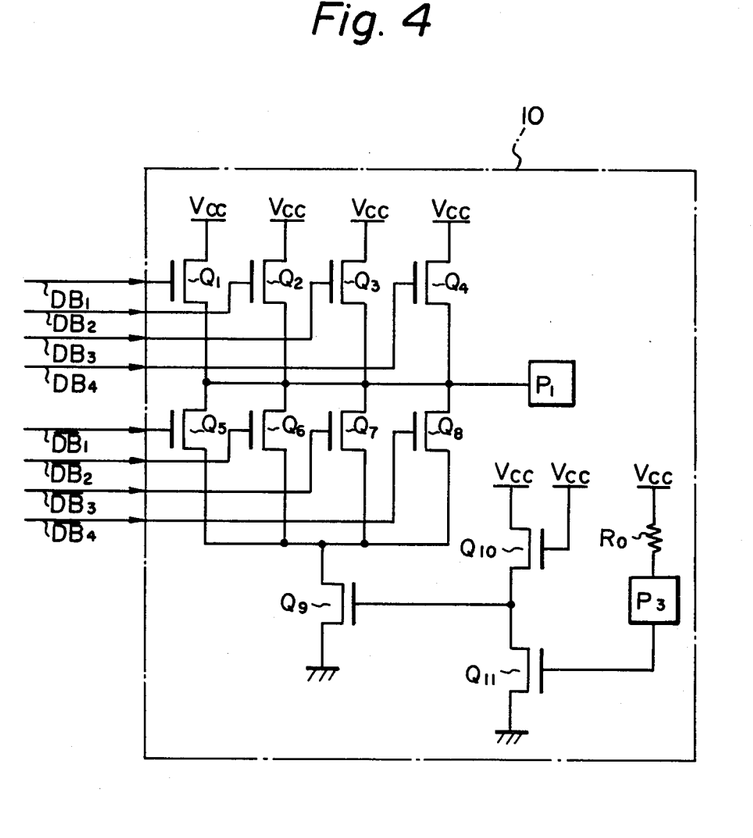
FIGS. 4 through 6 are modifications of FIG. 3.

FIG. 4 is a modification of FIG. 3. In FIG. 4, an inverter formed by a series of transistors $Q_{10}$ and $Q_{11}$, and a resistor $R_0$ are added to FIG. 3. In FIG. 4, when the potential at the pad $P_3$ is low, the potential at the gate of the transistor $Q_9$ is high, so as to cause the transistor $Q_9$ to conduct. In this state, the operation of the circuit of FIG. 4 is the same as that of the circuit of FIG. 3. However, as will be explained later in FIG. 9, the pad $P_3$ of FIG. 4 is used commonly for decoders of the block selection circuit 6 (FIG. 1), which is helpful in decreasing the number of pads.

Figure 5:
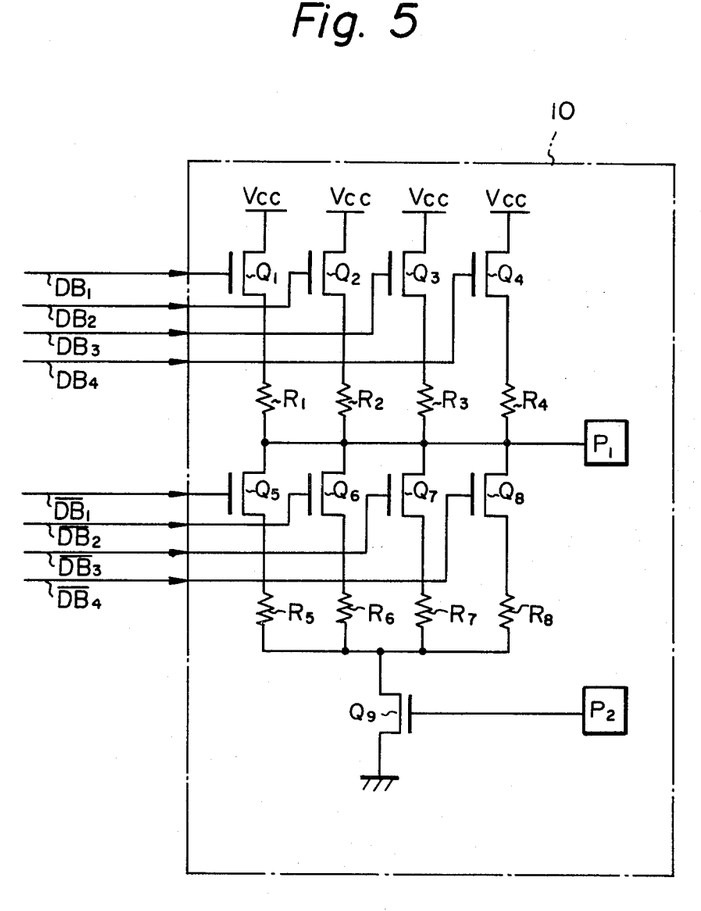

FIG. 5 is another modification of FIG. 3. In FIG. 5, each of the resistors $R_1$ through $R_8$ is connected in series to the transistors $Q_1$ through $Q_8$, respectively. In this case, the value of each of the resistors $R_1$ through $R_8$ is much larger than each of equivalent resistances of the on-state transistors $Q_1$ through $Q_8$. As a result, in the same way as in FIG. 3, when undesired data is written into a memory cell, the potential at the pad $P_1$ becomes at an intermediate value between the ground level and $V_{cc}$. However, this intermediate value is determined by the values of the resistors connected to the on-state transistors, not by the resistance of the transistors which are unstable. Therefore, in FIG. 5, the intermediate value is determined precisely by the values of the resistors $R_1$ through $R_8$.

Figure 6:
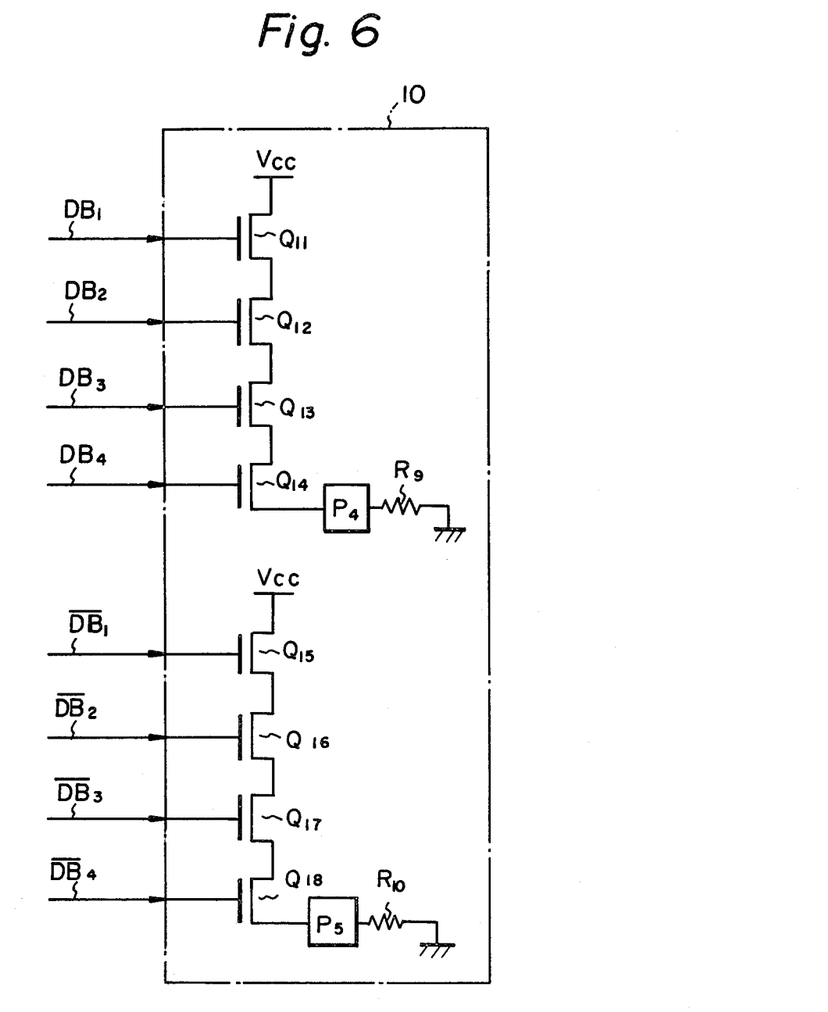

FIG. 6 is still another modification of FIG. 3. In FIG. 6, transistors $Q_{11}$ through $Q_{14}$, each having a gate connected to one of the positive data buses $DB_1$ through $DB_4$, are connected in series. One terminal of this series circuit is connected to the first power supply terminal ($V_{cc}$), while the other terminal is connected via a pad $P_4$ and a resistor $R_9$ to the second power supply terminal (the ground). Similarly, transistors $Q_{15}$ through $Q_{18}$, each having a gate connected to one of the negative data buses $\overline{DB_1}$ through $\overline{DB_4}$, are connected in series. One terminal of this series circuit is connected to the first power supply terminal ($V_{cc}$), while the other terminal is connected via a pad $P_5$ and a resistor $R_{10}$ to the second power supply terminal (the ground level).

In FIG. 6, when the same data is normally written into each of the memory cells to which the same address is allocated, the potential at one of the pads, $P_4$ or $P_5$, becomes high and equals $V_{cc}$ and the potential at the other pad becomes low and equals the ground level. Now assume that the data "1" is written into the memory cell $C_{00}$ (FIG. 2) of each of the memory blocks 1-1, 1-2, 1-3 and 1-4. When this data is read out, the potential of each of the data buses $DB_1$ through $DB_4$ is high, and the potential of each of the data buses $\overline{DB_1}$ through $\overline{DB_4}$ is low. As a result, the transistors $Q_{11}$ through $Q_{14}$ are turned on, so that the potential at the pad $P_4$ equals $V_{cc}$. In addition, the transistors $Q_{15}$ through $Q_{18}$ are turned off, so that the potential at the pad $P_5$ equals the ground level. Similarly, when the same date "0" is normally written into the memory cell $C_{01}$ (FIG. 2) of each of the memory blocks 1-1, 1-2, 1-3 and 1-4 (FIG. 1), the potential at the pad $P_4$ equals the ground level and the potential at the pad $P_5$ equals $V_{cc}$.

However, when the data "0" is written into the memory cell $C_{00}$ (FIG. 2) of the memory block 1-1 (FIG. 1), in spite of the attempt to write the data "1" thereinto, the transistor $Q_{11}$ is turned off and the transistors $Q_{16}$, $Q_{17}$ and $Q_{18}$ are also turned off. As a result, the potentials at the pads $P_4$ and $P_5$ both become low and equal the ground level. Similarly, when the data "1" is written into the memory cell $C_{01}$ (FIG. 2) of the memory block 1-1 (FIG. 1), in spite of the attempt to write the data "0" thereinto, the transistors $Q_{12}$, $Q_{13}$ and $Q_{14}$ are turned off and the transistor $Q_{15}$ is also turned off. As a result, also in this case, the potentials at the pads $P_4$ and $P_5$ both become low and equal the ground level.

In summary, if the same data "1" or "0" is normally written into memory cells to which the same address is allocated, the potential at one pad becomes $V_{cc}$ and the potential at the other pad becomes the ground level. However, if undesired data is written into at least one memory cell, the potentials at the pads $P_4$ and $P_5$ both become the ground level. Therefore, by checking the potentials at the pads $P_4$ and $P_5$ of FIG. 6, it can be determined whether the device of FIG. 1 is normal or abnormal.

Figure 7:
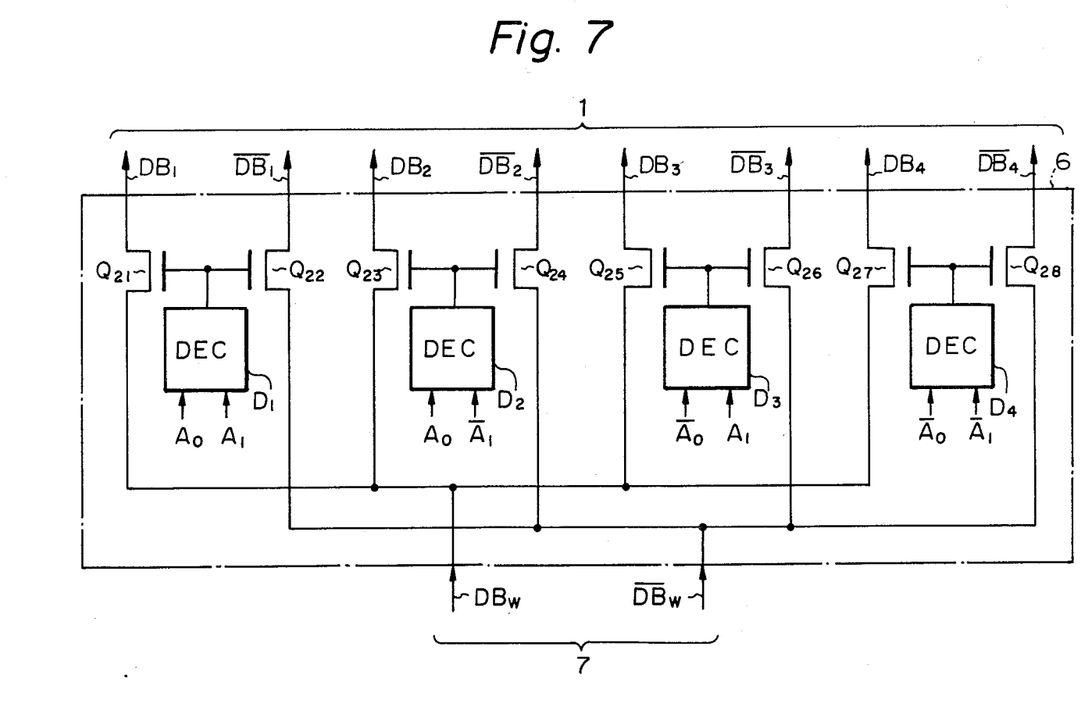
FIG. 7 is a circuit diagram of the block selection circuit 6 of FIG. 1.

FIG. 7 is a circuit diagram of the block selection circuit 6 of FIG. 1. A plurality of transfer gate transistors $Q_{21}, Q_{22}, \ldots, Q_{28}$ are provided in order to selectively connect the data buses $DB_1, \overline{DB_1}, \ldots, DB_4$ to the data buses $DB_w$ and $\overline{DB_w}$ which are connected to the write buffer 7. The transfer gate transistors $Q_{21}, Q_{22}, \ldots, Q_{28}$ are controlled by decoders $D_1, D_2, D_3$ and $D_4$ which will now be explained.

Figure 8:
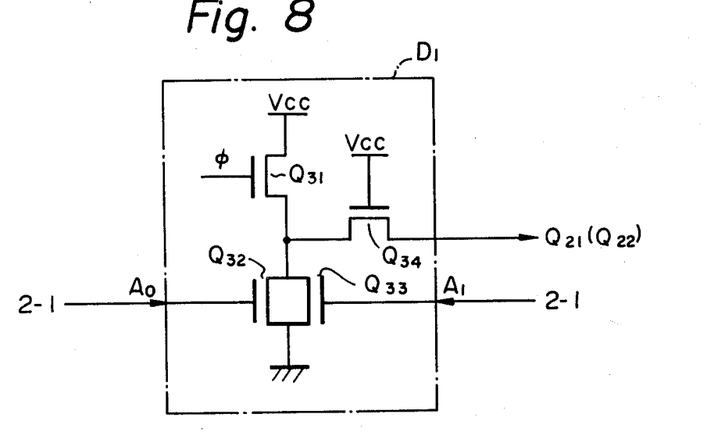
FIG. 8 is a circuit diagram of the decoder $D_1$ of FIG. 7.

FIG. 8 is a circuit diagram of the decoder $D_1$ of FIG. 7. Note that the circuits of the other decoders $D_2, D_3$ and $D_4$ are the same as that of the decoder $D_1$. In FIG. 8, $Q_{31}$ is a transistor for activating the decoder of FIG. 7 when the potential of a clock signal $\phi$ is high; $Q_{32}$ and $Q_{33}$ are transistors for receiving the address signals $A_0$ and $A_1$ from the row address buffers 2-1 (FIG. 1); and $Q_{34}$ is a transfer gate transistor. In this decoder $D_1$, only when the potentials of the address signals $A_0$ and $A_1$ are both low and the potential of the clock signal $\phi$ is high, can the transistor $Q_{34}$ transmit a high potential signal.

Therefore, in FIG. 7, only one of the decoders $D_1, D_2, D_3$ and $D_4$ transmits such a high potential signal in accordance with a combination of the address signals $A_0$ and $A_1$, so as to select one of the blocks 1-1, 1-2, 1-3 and 1-4 of FIG. 1.

Figure 9:
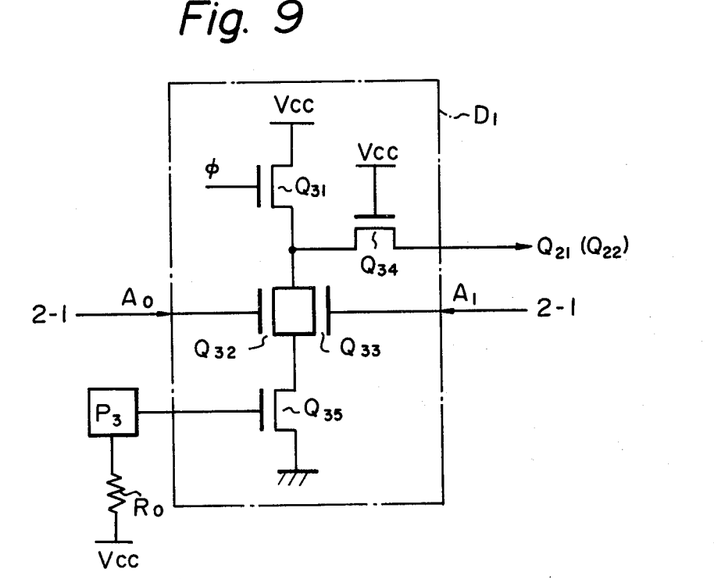
FIG. 9 is a modification of FIG. 8.

FIG. 9 is a modification of FIG. 8. In FIG. 9, a transistor $Q_{35}$, a pad $P_3$ and a resistor $R_0$, which serve as a simultaneous write means, are added to FIG. 8. Note that, the pad $P_3$ and the resistor $R_0$, which are the same as in FIG. 4, are common to the other decoders $D_2, D_3$ and $D_4$ of FIG. 7.

During the normal mode, the potential at the pad $P_3$ is high, since no probe is placed on the pad $P_3$. As a result, the transistor $Q_{35}$ is turned on. Therefore, in this state, the operation of the circuit of FIG. 9 is the same as that of the circuit of FIG. 8.

However, during the write mode for writing test data, the potential at the pad $P_3$ is caused to be low, so as to turn off the transistor $Q_{35}$, regardless of the state of the transistors $Q_{32}$ and $Q_{33}$; that is, regardless of the address signals $A_0$ and $A_1$. Therefore, in FIG. 7, all of the transistors $Q_{21}$ through $Q_{28}$ are turned on, so that all the blocks 1-1, 1-2, 1-3 and 1-4 (FIG. 1) are selected. Therefore, in FIG. 1, input data $D_{in}$ supplied to the write buffer WB is written simultaneously into memory cells to which the same address is allocated. Thus, the write operation for writing test data by the block selection circuit 9, including the decoders as illustrated in FIG. 9, can be performed four-times faster, as compared with the case where the block selection circuit 9 comprises the decoders as illustrated in FIG. 8.

In the above-mentioned embodiment, the test circuit 10 is connected to all the data buses $DB_1, \overline{DB_1}, \ldots, \overline{DB_4}$, so that the stray capacitance of each of the data buses is increased. However, since only one gate of a MOS transistor is connected to each of the data buses, such an increase of the stray capacitance can be neglected. In addition, in the above-mentioned embodiment, a semiconductor memory device, including memory cells of a dynamic type, is illustrated; however, the present invention can be applied to a semiconductor memory device of a static type.

As explained hereinbefore, the semiconductor memory device according to the present invention has an advantage in that the time required for testing the device can be reduced, since the read test time can be reduced to 1/n where n is the number of memory blocks. In addition, the write test time can be reduced, which also decreases the time for testing the device.

I claim:

1. A semiconductor memory device having a write mode and a read mode, comprising:

first and second power supply terminals;

a plurality of memory blocks each comprising memory cells arranged in rows and columns;

a plurality of pairs of data buses, each pair being operatively connected to one of said memory blocks;

cell selection means, operatively connected to said memory blocks, for selecting one memory cell within each of said memory blocks and connecting the selected memory cells to the corresponding data buses;

write data buses;

read data buses;

a block selection circuit, operatively connected to said pairs of data buses, said read data buses and said write data buses, for selecting one pair of said pairs of data buses during the read mode and connecting said selected pair of data buses to said read data buses, and for selecting one pair of said pairs of data buses during the write mode and connecting the selected pair of data buses to said write data buses, said block selection circuit comprising simultaneous write means for selecting all of said pairs of data buses to simultaneously write input data in all of the selected memory cells selected by said cell selection means; and a read test circuit, operatively connected to said first and second power supply terminals and to said data buses, for detecting the potential of each of said data buses and for checking simultaneously whether or not the data on said data buses transmitted from the selected memory cells is correct.

2. A semiconductor memory device having normal and read test modes, comprising:

first and second power supply terminals;

a plurality of memory blocks each comprising memory cells arranged in rows and columns;

a plurality of pairs of data buses, each pair being operatively connected to one of said memory blocks and comprising a positive data bus and a negative data bus;

cell selection means, operatively connected to said memory blocks, for selecting one memory cell within each of said memory blocks and connecting the selected memory cells to the corresponding data buses;

write data buses;

read data buses;

a block selection circuit, operatively connected to said pairs of data buses, said read data buses and said write data buses, for selecting one pair of said pairs of data buses during the read mode and connecting said selected pair of data buses to said read data buses, and for selecting one pair of said pairs of data buses during the normal mode and connecting the selected pair of data buses to said write data buses, said block selection circuit comprising simultaneous write means for selecting all of said pairs of data buses to simultaneously write input data in all of the selected memory cells selected by said cell selection means; and a read test circuit, operatively connected to said first and second power supply terminals and to said data buses, for detecting the potential of each of said data buses and for checking simultaneously whether or not the data on said data buses transmitted from the selected memory cells is correct, said read test circuit comprising:

an output terminal;

a plurality of first transistors each having a drain operatively connected to said first power supply terminal, a gate operatively connected to one of the positive data buses and a source operatively connected to said output terminal;

a plurality of second transistors each having a drain operatively connected to said output terminal, a gate operatively connected to one of the negative data buses, and a source; and a third transistor having a drain operatively connected to the sources of said second transistors, a gate, and a source operatively connected to said power supply terminal, the potential of the gate of said third transistor being set at a first level so as to be in a non-conductive state when said third transistor is in the normal mode and being set at a second level so as to be in a conductive state when said third transistor is in the read test mode.

3. A semiconductor memory device as set forth in claim 2, wherein said read test circuit further comprises a plurality of resistors each operatively connected in series to one of said first and second transistors.

4. A semiconductor memory device as set forth in claim 2, wherein said read test circuit further comprises an inverter circuit operatively connected between the gate of said third transistor and said first power supply.

5. A semiconductor memory device comprising:

first and second power supply terminals;

a plurality of memory blocks each comprising memory cells arranged in rows and columns;

a plurality of pairs of data buses, each pair being operatively connected to one of said memory blocks and comprising a positive data bus and a negative data bus;

cell selection means, operatively connected to said memory blocks, for selecting one memory cell within each of said memory blocks and connecting the selected memory cells to the corresponding data buses;

write data buses;

read data buses;

a block selection circuit, operatively connected to said pairs of data buses, said read data buses and said write data buses, for selecting one pair of said pairs of data buses during a read mode and connecting said selected pair of data buses to said read data buses, and for selecting one pair of said pairs of data buses during a write mode and connecting the selected pair of data buses to said write data buses, said block selection circuit comprising simultaneous write means for selecting all of said pairs of data buses to simultaneously write input data in all of the selected memory cells selected by said cell selection means; and a read test circuit, operatively connected to said first and second power supply terminals and to said data buses, for detecting the potential of each of said data buses and for checking simultaneously whether or not the data on said data buses transmitted from the selected memory cells is correct, said read test circuit comprising:

first and second resistors operatively connected to said second power supply terminal;

first and second output terminals each operatively connected to said first and second resistors, respectively;

a plurality of first transistors operatively connected in series between said first output terminal and said first power supply terminal, each of said first transistors having a gate operatively connected to one of the positive data buses; and a plurality of second transistors operatively connected in series between said second output terminal and said first power supply terminal, each of said second transistors having a gate connected to one of the negative data buses.

6. A semiconductor memory device, comprising:

first and second power supply terminals;

a plurality of memory blocks each comprising memory cells arranged in rows and columns;

a plurality of pairs of data buses, each pair being operatively connected to one of said memory blocks;

cell selection means, operatively connected to said memory blocks, for selecting one memory cell within each of said memory blocks and connecting the selected memory cells to the corresponding data buses;

write data buses;

read data buses;

a block selection circuit, operatively connected to said pairs of data buses, said read data buses and said write data buses, for selecting one pair of said pairs of data buses during a read mode and connecting the selected pair of data buses to said read data buses, and for selecting one pair of said pairs of data buses during a write mode and connecting the selected pair of data buses to said write data buses, said block selection circuit comprising:

simultaneous write means for selecting all of said pairs of data buses to simultaneously write input data in all of the selected memory cells selected by said cell selection means;

a plurality of pairs of transfer gate transistors, each pair operatively connected to one of said pairs of data buses, for receiving input data; and a plurality of decoders, each operatively connected to one of said pairs of transfer gate transistors, for selecting one pair of said pairs of data buses; and a read test circuit, operatively connected to said first and second power supply terminals and to said data buses, for detecting the potential of each of said data buses and for checking simultaneously whether or not the data on said data buses transmitted from the selected memory cells is correct.

7. A semiconductor memory device as set forth in claim 5, wherein said block selection circuit further comprises simultaneous write means, operatively connected to each of said decoders, for enabling said decoders to select all of said pairs of data buses so as to simultaneously write input data into all of the selected memory cells selected by said cell selection means.

8. A semiconductor memory device as set forth in claim 7, wherein said simultaneous write means comprises:

a write transistor operatively connected between said decoders and said second power supply; and a resistor operatively connected between said write transistor and said first power supply.

* * * * *

UNITED STATES PATENT AND TRADEMARK OFFICE
CERTIFICATE OF CORRECTION

PATENT NO. : 4,464,750

DATED : August 7, 1984

INVENTOR(S) : TAKEO TATEMATSU

It is certified that error appears in the above-identified patent and that said Letters Patent is hereby corrected as shown below:

Column 1, line 52, delete ":";
line 55, after "are", insert --a--.

Column 3, line 8, "$BL_{127}$", second occurrence, should be --$\overline{BL}_{127}$--;
line 59, "memroy" should be --memory--;
line 63, delete "are".

Column 5, line 6, "resistance" should be --resistances--;
line 38, "date" should be --data--.

Column 6, line 2, "$DB_w$", second occurrence, should be --$\overline{DB}_w$--.

Signed and Sealed this

Twelfth Day of March 1985

[SEAL]

Attest:

DONALD J. QUIGG

Attesting Officer     Acting Commissioner of Patents and Trademarks